United States Patent
Hekmatshoartabari et al.

(10) Patent No.: US 9,123,842 B2
(45) Date of Patent: Sep. 1, 2015

(54) PHOTORECEPTOR WITH IMPROVED BLOCKING LAYER

(75) Inventors: Bahman Hekmatshoartabari, White Plains, NY (US); Jeehwan Kim, Los Angeles, CA (US); Devendra K. Sadana, Pleasantville, NY (US); Ghavam G. Shahidi, Round Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 13/554,886

(22) Filed: Jul. 20, 2012

(65) Prior Publication Data

US 2013/0344644 A1 Dec. 26, 2013

Related U.S. Application Data

(63) Continuation of application No. 13/527,961, filed on Jun. 20, 2012.

(51) Int. Cl.
*H01L 21/00* (2006.01)
*H01L 31/0352* (2006.01)
*H01L 31/103* (2006.01)
*B82Y 20/00* (2011.01)

(52) U.S. Cl.
CPC ......... *H01L 31/035236* (2013.01); *B82Y 20/00* (2013.01); *H01L 31/1037* (2013.01)

(58) Field of Classification Search
CPC ................................................. H01L 21/02425
See application file for complete search history.

(56) References Cited

U.S. PATENT DOCUMENTS

| | | | | |
|---|---|---|---|---|
| 33,094 | A | * 8/1861 | Maruyama et al. | 521/42.5 |
| 4,378,417 | A | * 3/1983 | Maruyama et al. | 430/57.5 |
| 4,394,425 | A | 7/1983 | Shimizu et al. | |
| 4,641,168 | A | * 2/1987 | Yamazaki et al. | 257/53 |
| 4,672,015 | A | * 6/1987 | Maruyama et al. | 430/57.5 |
| 4,686,165 | A | 8/1987 | Suda et al. | |
| 4,731,640 | A | * 3/1988 | Bluzer | 257/291 |
| 4,737,429 | A | * 4/1988 | Mort et al. | 430/57.5 |
| 4,778,741 | A | 10/1988 | Yasui et al. | |

(Continued)

OTHER PUBLICATIONS

A.G. Johnstock, "The Properties of Microcrystalline and Amorphous Silicon Electron Blocking Layers in a-Si Alloy Photoreceptors", Mat. Res. Soc. Symp. Proc. vol. 95 (1987), Materials Research Society.

(Continued)

*Primary Examiner* — Zandra Smith
*Assistant Examiner* — Andre' C Stevenson
(74) *Attorney, Agent, or Firm* — Louis J. Percello, Esq.; Otterstedt, Ellenbogen & Kammer, LLP

(57) ABSTRACT

A photoreceptor includes a multilayer blocking structure to reduce dark discharge of the surface voltage of the photoreceptor resulting from electron injection from an electrically conductive substrate. The multilayer blocking structure includes wide band gap semiconductor layers in alternating sequence with one or more narrow band gap blocking layers. A fabrication method of the photoreceptor includes transfer-doping of the narrow band gap blocking layers, which are deposited in alternating sequence with wide band gap semiconductor layers to form a blocking structure. Suppression of hole or electron injection can be obtained using the method.

18 Claims, 2 Drawing Sheets

(56) References Cited

U.S. PATENT DOCUMENTS

| | | | |
|---|---|---|---|
| 4,804,608 A | 2/1989 | Tawada | |
| 5,422,209 A | 6/1995 | Ono et al. | |
| 5,453,860 A * | 9/1995 | Akiyama et al. | 349/28 |
| 5,514,507 A | 5/1996 | Yagi et al. | |
| 5,556,729 A | 9/1996 | Fukduda et al. | |
| 5,640,260 A * | 6/1997 | Sumida | 349/26 |
| 6,322,942 B1 | 11/2001 | Chou et al. | |
| 7,122,827 B2 * | 10/2006 | Alizadeh et al. | 257/17 |
| 2004/0048180 A1 * | 3/2004 | Kojima et al. | 430/69 |
| 2008/0035965 A1 | 2/2008 | Hayashi et al. | |
| 2009/0165839 A1 | 7/2009 | Zeman et al. | |
| 2010/0276594 A1 | 11/2010 | Rafailov et al. | |
| 2010/0314679 A1 | 12/2010 | Lee | |

OTHER PUBLICATIONS

R.A. Street, "Hydrogenated Amourphous Silicon" (2005), pp. 396-399, Cambridge Univ. Press.

* cited by examiner

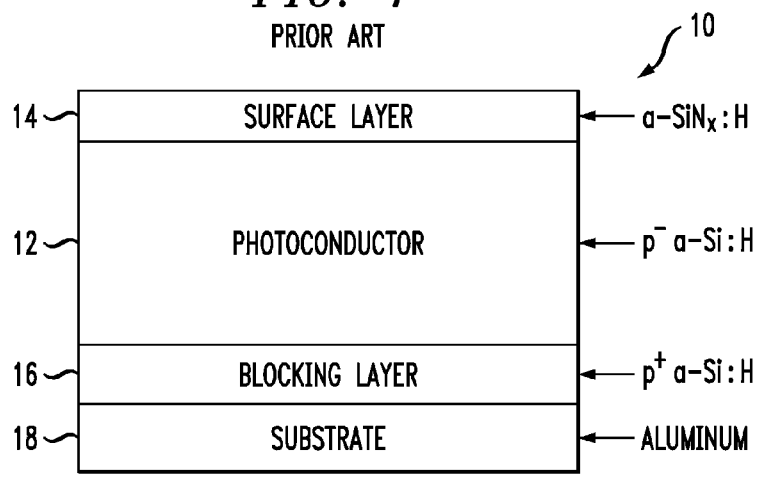
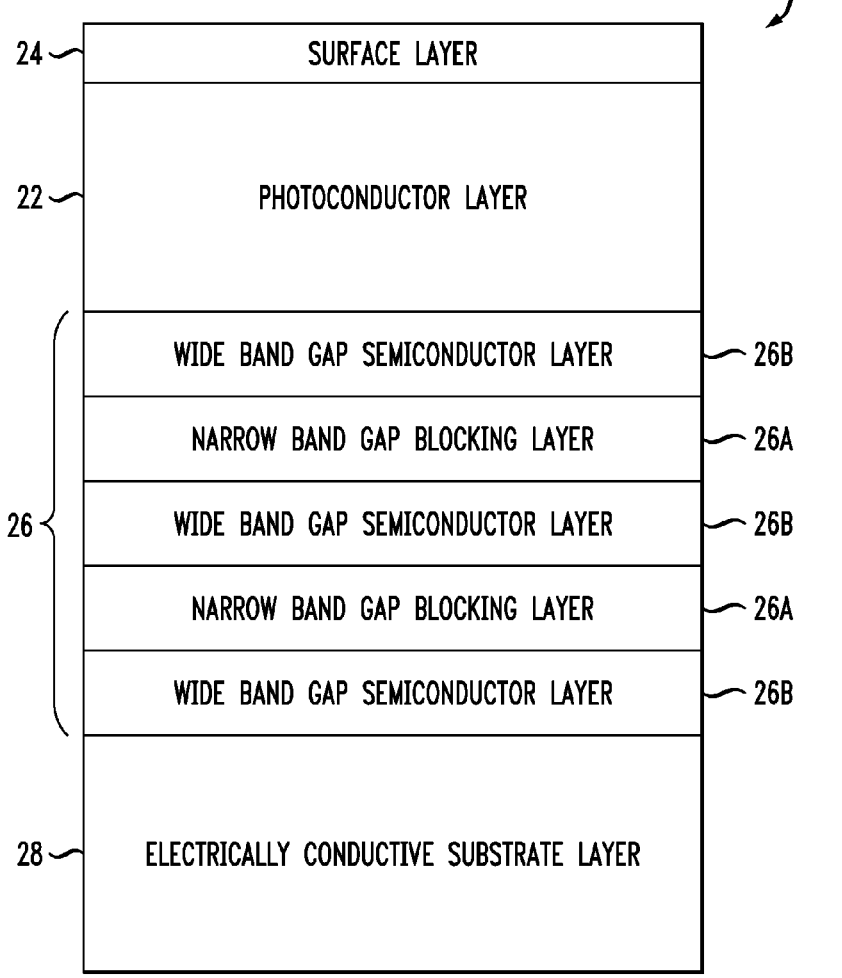

PHOTORECEPTOR WITH IMPROVED BLOCKING LAYER

CROSS-REFERENCE TO RELATED APPLICATION

This application is a continuation of U.S. patent application Ser. No. 13/527,961 filed Jun. 20, 2012, the complete disclosure of which is expressly incorporated herein by reference in its entirety for all purposes.

FIELD

The present disclosure relates to the physical sciences and, more particularly, to photoreceptors, including those based on hydrogenated amorphous silicon.

BACKGROUND

Photoreceptors based on hydrogenated amorphous silicon (a-Si:H) are currently used in commercial xerographic photocopy machines and laser printers. A photoreceptor of this type has a surface that is charged by a corona discharge. Charge acceptance refers to the maximum charge that may be induced on the surface by corona discharge. An image of an item to be copied is projected onto the surface. Exposure of the photoreceptor to the image causes selective discharge of the surface caused by photoconductivity in the photoreceptor. An electrostatic image is thereby formed. The image is developed by attaching toner particles to the charged surface regions of the photoreceptor and then transferring the toner to paper or other suitable material where it is fused by heat or pressure to produce a permanent image.

The surface voltage of a photoreceptor is subject to discharge over time even in the absence of light. This is known as dark discharge. Thermal generation of bulk carriers, injection from the back contact and dielectric breakdown contribute to dark discharge. A low dark current facilitates the holding of the surface charge. High photoconductivity is desirable for allowing rapid discharge in the presence of light.

Referring to FIG. 1, a xerographic photoreceptor 10 includes a hydrogenated amorphous silicon photoconductor layer 12, a hydrogenated amorphous silicon nitride or silicon carbide surface/passivation layer 14, a dielectric blocking layer 16 and a metal (e.g. aluminum) substrate 18. The dielectric blocking layer 16 (e.g. p+a-Si:H) helps suppress injection from the back contact (i.e. the substrate 18). Light boron doping of the photoconductor layer 12 (p− a-SiH) reduces bulk thermal generation of carriers. The surface layer 14 helps reduce surface conduction and thereby prevents the blurring of the latent image. It also serves to protect the a-Si:H surface from scratching.

BRIEF SUMMARY

In accordance with the principles discussed herein, a photoreceptor is provided that limits dark discharge. The photoreceptor includes a photoconductor layer comprising a photoconductive material, for example hydrogenated amorphous silicon (a-Si:H), and an electrically conductive substrate layer. The photoconductor layer may or may not contain C, Ge, N, O, Cl, F, D or combinations thereof. In some embodiments, the photoconductor layer may contain a nanocrystalline or microcrystalline portion. A multilayer blocking structure is positioned between the substrate layer and the photoconductor layer. The blocking structure includes first and second wide band gap semiconductor layers and a narrow band gap blocking layer between and adjoining the first and second wide band gap semiconductor layers. The narrow band gap blocking layer is effective to block electron or hole injection from the electrically conductive substrate into the photoconductor layer.

A photoreceptor further in accordance with the principles discussed herein includes a photoconductor layer containing a photosensitive material such as hydrogenated amorphous or nanocrystalline semiconductor material. A multilayer blocking structure is positioned between the photoconductor layer and an electrically conductive substrate layer. The multilayer blocking structure includes a plurality of wide band gap semiconductor layers. One or more of the wide band gap semiconductor layers comprises, for example, a-SiC:H, a-SiO:H, a-SiN:H, a-Si:H or combinations thereof. The wide-gap layers may further include Ge, Cl, F, D or combinations thereof. The multilayer blocking structure further includes one or more narrow band gap blocking layers. Each narrow gap blocking layer may comprise, for example, a-SiGe:H, a-Ge:H, or a-Si:H. The one or more narrow band gap blocking layers and the plurality of wide band gap semiconductor layers are arranged in alternating sequence. The one or more narrow band gap blocking layers are effective to block electron or hole injection from the electrically conductive substrate layer into the photoconductor layer. The wide-gap layers present in the blocking layer have band gaps larger than that of the narrow-gap layer(s). However, a wide-gap layer may have a band gap larger, equal or smaller than that of the photoconductor layer.

In accordance with further principles discussed herein, a fabrication method is disclosed for fabricating photoreceptors exhibiting reduced dark discharge while maintaining satisfactory carrier transport during illumination. The method includes providing an electrically conductive substrate and forming a multilayer blocking structure on the substrate. The multilayer blocking structure is created in part by forming a plurality of wide band gap semiconductor layers. One or more of the wide gap layers may be comprised of a-Si:H, a-SiC:H, a-SiO:H, a-SiN:H, or combinations thereof. The wide-gap layers may include Ge, Cl, F, D or combinations thereof. One or more narrow band gap blocking layers having a band gap or band gaps lower than that of the wide-gap layers are formed over the substrate in alternating sequence with the wide band gap semiconductor layers. Each blocking layer may be formed, for example, of a-Ge:H, a-SiGe:H or a-Si:H. The narrow-gap layers may include C, Cl, F, D or combinations thereof. Both wide-gap and narrow-gap layers may contain a crystalline portion, i.e. be nano/micro-crystalline instead of completely amorphous. The band gaps of both the wide-gap and narrow-gap layers can be tuned by composition, crystalline fraction, growth conditions, and combinations thereof. Transfer doping of the one or more narrow band gap layers occurs as holes are transferred from the wide gap semiconductor layers, forming one or more p+ doped layers. A photoconductor layer comprising a photosensitive material, for example hydrogenated amorphous silicon, is formed over the blocking structure. The photoconductor layer may include C, Cl, F, D, Ge or combinations thereof. The photoconductor layer may further include a crystalline portion. The narrow band gap blocking layer(s) is effective in blocking electron injection from the substrate into the photoconductor layer.

A second method of fabricating a photoreceptor includes providing an electrically conductive substrate, forming a multilayer blocking structure on the substrate by 1) forming a plurality of wide band gap semiconductor layers over the substrate, and 2) forming one or more narrow band gap blocking layers having band gaps lower than the band gaps of the wide band gap semiconductor layers over the substrate in alternating sequence with the plurality of wide band gap semiconductor layers, causing transfer-doping of electrons from the wide band gap semiconductor layers to the one or more narrow band gap blocking layers, and forming a photoconductor layer comprised of photosensitive material on the multilayer blocking structure such that the one or more narrow band gap blocking layers are effective to suppress hole injection into the photoconductor layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Effective blocking of electron injection into the photoconductor layer from the electrically conductive substrate;
Reduced electron injection into the photoconductor layer from the blocking layer;
Low dark discharge;
Low series resistance (associated with the back contact) under light.

These and other features and advantages of the present invention will become apparent from the following detailed description of illustrative embodiments thereof, which is to be read in connection with the accompanying drawings.

BRIEF DESCRIPTION OF THE DRAWINGS

FIG. 1 shows a schematic illustration of a prior art a-Si:H photoreceptor;

FIG. 2 shows a schematic illustration of a photoreceptor in accordance with a first exemplary embodiment;

DETAILED DESCRIPTION

Figure 3A:
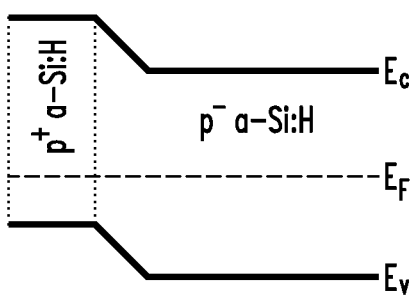
FIGS. 3A and 3B show, respectively, schematic simplified energy band diagrams of a conventional blocking layer and a blocking layer in accordance with an exemplary embodiment.

Photoreceptors are disclosed that are characterized by relatively low levels of dark discharge. In exemplary embodiments, an improved blocking layer is incorporated in such photoreceptors. Methods of fabricating photoreceptors having improved blocking layers are also provided.

The structure of an exemplary photoreceptor 20 based on hydrogenated amorphous silicon (a-Si:H) is shown in FIG. 2. A surface layer 24 (typically amorphous silicon nitride) is provided for reducing the surface conduction and therefore preventing the blurring of the latent image. It also serves to protect the a-Si:H surface from scratching. Other insulating materials such as amorphous silicon oxide, amorphous silicon carbide or amorphous carbon may be used to form the surface layer as well. An a-Si:H photoconductor layer 22 (also known by those of skill in the art as photoreceptive layer, or transport layer) is typically doped slightly p-type to compensate for the slight intrinsic n-type conductivity of undoped a-Si:H by counterdoping and therefore reduce the dark conductivity of the a-Si:H photoconductor layer 22 (12 in FIG. 1) and as a result reduce the dark discharge of the surface voltage. Another source of dark discharge, as discussed above with respect to FIG. 1, is electron injection from the back contact 28 (i.e. conductive substrate, which is typically aluminum). To reduce electron injection, a high activated doping level in the $p^+$ blocking layer is desired so that electron flow from the conductive substrate 28 (18 in FIG. 1) is effectively blocked by electron-hole recombination in the highly-doped $p^+$ layer. The doping efficiency of acceptors in $p^+$ a-Si:H is fundamentally low because of the large valence band tail density of states in a-Si:H. Therefore, a thick $p^+$ a-Si:H layer (typically a few hundred nanometers) has been used in structures such as shown in FIG. 1 to effectively block electron injection from the conductive substrate 18 into the photoconductive layer 12. However, such a thick layer of $p^+$ a-Si:H itself injects a considerable number of electrons into the photoconductive layer 12. This is because thermal generation of electrons and holes in doped a-Si:H layers is high due to the presence of a large density of defects. Electron injection from the $p^+$ a-Si:H layer into the photoconductive layer has the same effect as that of electron injection from the substrate, contributing to the dark discharge of the photoreceptor. As a result, the effectiveness of the $p^+$ a-Si:H layer 16 in preventing electron flow into the photoconductive layer 12 in the photoreceptor shown in FIG. 1 is fundamentally limited.

Figure 3B:
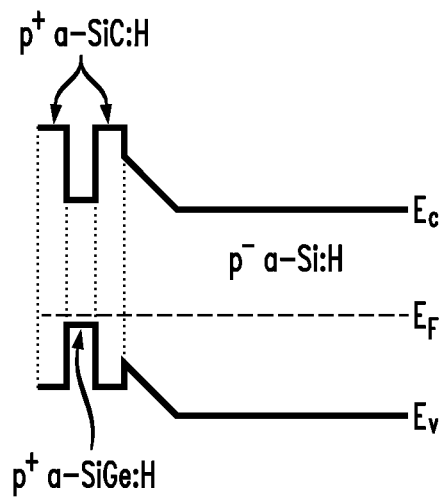
Figure 4:
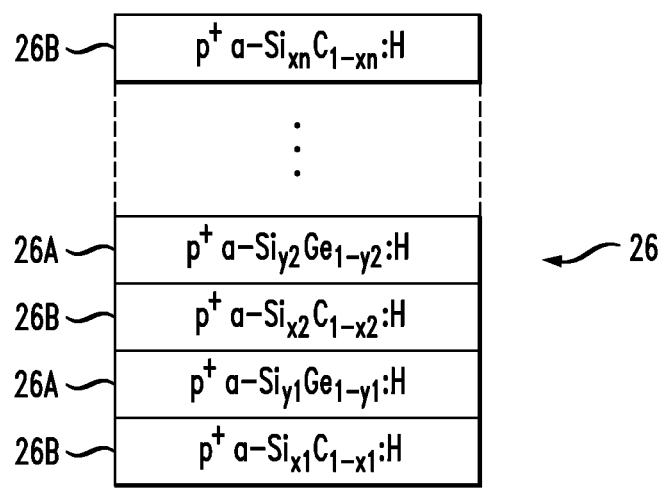
FIG. 4 shows a schematic illustration of a multilayer blocking structure in accordance with an exemplary embodiment.

The above-referenced issues are addressed in accordance with the exemplary embodiments disclosed herein by employing a multilayer blocking structure 26 as shown in FIGS. 2 and 4. Simplified schematic energy band diagrams of the conventional blocking layer 16 and an exemplary blocking structure 26 according to the present disclosure (comprised of three layers, i.e. n=2, and employing two a-SiC:H wide band gap layers are given in FIGS. 3A and 3B, respectively. The band gaps of both the wide-gap and narrow-gap layers comprising the blocking structure 26 can be tuned by composition, crystalline fraction, growth conditions, and combinations thereof. The narrow-gap blocking layer(s) 26A is doped by transfer-doping (also known as modulation doping), i.e. hole transfer from the wide gap semiconductor layers 26B into the narrow-gap material, forming one or more p+ doped layers. (As discussed further below, the present disclosure further relates to photoreceptors that employ n+ blocking layer(s) 26A to suppress hole injection into the photoconductor layer.) Doping efficiency of amorphous materials is generally low because of the large density of defects in these materials, and also because the introduction of impurity atoms (dopants) creates extra defects. (This phenomenon is known as defect-dopant coupling, or dopant-induced defect creation). Doping efficiency of a-Ge:H or a-SiGe:H is generally lower than that of a-Si:H; however, a narrow band gap layer comprising a-Ge:H or a-SiGe:H may be efficiently doped by transfer of holes from a-SiC:H, a-SiO:H, a-SiN:H (or combinations thereof) without the need to introduce extra dopants in a-Ge:H or a-SiGe:H. As a result, electrons injected from the conductive substrate are effectively blocked by the highly doped $p^+$ a-Ge:H or a-SiGe:H layer. Since each p+a-Ge:H or a-SiGe:H layer 26A is efficiently doped, thin layers of $p^+$ a-Ge:H or a-SiGe:H are sufficient for effective blocking of electrons, and electron injection from such thin layers are small. The wide band gap layers 26B are also sufficiently thin to maintain low electron injection from these materials into the photoconductive layer 22. In addition, sufficiently thin wide gap layers prevent compromising carrier transport during illumination. The formation of mini-bands in the a-SiGe:H layers due to quantum confinement, as known in the art, may partially facilitate carrier transport across the a-SiGe:H layer during illumination. The total thickness of the wide-gap layers 26B is preferably below 50 nm, although larger thicknesses are also possible. The thickness of each of the wide band gap layers 26B is preferably is preferably in the range of 5 to 25 nm, although thicker or thinner layers can be used as well. The total thickness of the narrow band gap layers 26A is preferably below 75 nm, although larger thicknesses are also possible. The thickness of each of the narrow-gap layers is preferably in the range of 3 to 30 nm, although thinner or thicker layers can be used as well. As shown in FIG. 2, one of the wide band gap semiconductor layers 26B of the photoreceptor 20 adjoins the photoconductor layer 22 while another of the wide band gap semiconductor layers 26B adjoins the electrically conductive substrate layer 28.

A wide-gap layer present in the blocking layer has a band gap larger than that of a narrow-gap layer by at least 0.1 eV and preferably by at least 0.2 eV. The terms "wide" and "narrow" as applied to the band gaps of the wide band gap semiconductor layers and narrow band gap blocking layers described herein are accordingly relative terms. However, a wide-gap semiconductor layer may have a band gap larger, equal or smaller than that of the photoconductive layer. The band gap of a-Si:H is typically in the range of 1.7-1.8 eV; however, as known in the art, larger or smaller band gaps are possible by varying the deposition conditions. The band gap of a-Ge:H is typically in the range of 0.9-1.2 eV; however, similar to a-Si:H, larger and smaller band gaps are also possible. An alloy of two semiconductor materials has a band gap depending linearly on the atomic fractions of the two semiconductors, e.g. an alloy of a-Si$_x$Ge$_{1-x}$ has a band gap of $xE_{g1}+(1-x)E_{g2}$, where $E_{g1}$ is the band gap of a-Si:H, $E_{g2}$ is the band gap of a-Ge:H, x the atomic fraction of Si (number of Si atoms in the lattice divided by the total number of Si and Ge atoms), and $_{1-x}$ the atomic fraction of Ge. (note that 0≤x≤1). Similarly, the band gap of an a-Si$_x$C$_{1-x}$:H alloy is increased typically from 1.7-1.8 eV to 3.6-3.7 eV as the atomic fraction of C is increased from 0 to 1. Addition of N, O or both to a-Si:H, a-Ge:H or a-SiGe:H increases the band gap, but the increase in band gap is not typically a linear function of the atomic percentage. Hydrogenated amorphous silicon-nitride (a-Si$_x$N$_{1-x}$:H) typically has a band gap of 5-5.5 eV for the stoichiometric composition x=0.42, and the band gap can be varied by changing the atomic percentage of N. Hydrogenated amorphous silicon oxide (a-SiO:H) has band gaps comparable with a-SiN:H. The band gap of semiconductor alloys or oxides/nitrides may be varied by changing the crystalline portion of the materials. The band gap of nanocrystalline or microcrystalline materials is generally lower than that of amorphous materials having the same composition. The band gap of hydrogenated nano/microcrystalline Si varies between ~1.1 eV to ~1.8 eV as the material structure varies from fully single/poly-crystalline to fully amorphous. Similarly, the band gap of hydrogenated nano/microcrystalline Ge varies between ~0.6 eV to ~1.2 eV as the material structure varies from fully single/poly-crystalline to fully amorphous. The band gaps of hydrogenated nano/micro-crystalline SiC, SiO, SiGeO, GeO and SiN compounds are lower than that of a-SiC:H, a-SiO:H, a-SiGeO:H, a-GeO:H and a-SiN:H, respectively. (This also applies to combinations thereof). In the PECVD process, the crystalline portion of the materials may be increased by increasing the hydrogen dilution of the source gases, increasing the plasma frequency (typically up to 120 MHz) or both. For example, hydrogenated nano-crystalline silicon oxide (nc-SiO:H) may be grown by PECVD with band gap in the range of 0.8-2.5 eV, depending on the growth conditions and oxygen content of the film.

Referring to FIG. 4, a cross-sectional schematic illustration showing one embodiment of the disclosed blocking structure 26 (comprised of a superlattice multilayer, where n≥2) is provided. (Note that the special case of $x_i$=1 and $y_i$=1 which corresponds to the conventional structure shown in FIG. 1 is excluded). The wide band gap material may be a-SiC:H, a-SiO:H, a-SiN:H, a-SiNO:H, or a combination thereof. The wide-gap layers may include Ge, Cl, F, D or combinations thereof (only a-SiC:H shown in the figure), and may contain a crystalline fraction. The narrow band gap layers may be amorphous, nano, micro, or polycrystalline. Any or all of the layers may be substantially free of impurity (dopant) atoms or contain a low concentration of impurity (dopant) atoms (0≤$x_i$, $y_i$≤1; $x_i$ and $y_i$ may be constant or vary across each layer; for all 1≤i≤n). The index $x_i$ refers to the atomic percentage of Si in the a-SiC:H alloy (i.e. ratio of the number of Si atoms to the total number of Si and C atoms in the a-SiC:H lattice), forming the ith wide-gap layer. The atomic percentage of Si may be constant across the ith wide-gap layer or vary across the ith wide-gap layer, for example by varying the gas flow ratio of the Si-containing gas source to C-containing gas source during the growth of the ith wide-gap layer. The index $y_i$ refers to the atomic percentage of Si in the a-SiGe:H alloy (i.e. ratio of the number of Si atoms to the total number of Si and Ge atoms in the a-SiGe:H lattice), forming the ith narrow-gap layer. The atomic percentage of Si may be constant across the ith narrow-gap layer or vary across the ith narrow-gap layer, for example by varying the gas flow ratio of the Si-containing gas source to Ge-containing gas source during the growth of the ith narrow-gap layer. All layers may contain fluorine (F), deuterium (D), chlorine (Cl) or combinations thereof. The narrow band gap layers may intentionally or unintentionally contain C. Similarly, the wide band gap layers may intentionally or unintentionally contain Ge. As the blocking layers 26A in this illustrative embodiment are p+a-SiGe:H, they are effective to suppress electron injection into the photoconductor layer 22 of the photoreceptor 20.

As discussed above, p+ blocking layers such as employed in the exemplary blocking structure 26 of FIG. 4 suppress electron injection into the photoconductor layer 22 that may be injected from the conductive substrate 28 and the blocking structure itself. This disclosure further encompasses photoreceptors 20 that employ n+ blocking layers to suppress hole injection into the photoconductor layer 22. Referring to FIG. 2, the blocking structure 26 may include n+ wide band gap layers 26B and n+ narrow band gap blocking layers 26A. Modulation (transfer) doping of the narrow band gap blocking layer(s) 26A occurs as electrons are transferred thereto from the wide band gap layers 26B. It should be noted that in photoreceptors with p+ blocking layers such as shown in FIG. 4, the corona discharge induces negative charge on the top surface of the photoconductor layer 22, while in photoreceptors that use n+ blocking layers, the corona discharge is of the opposite polarity and induces positive charge on the top surface of the photoconductor layer. Transfer doping provides greater benefits with respect to p+ type blocking layers as p-type doping by dopant atoms is typically less efficient than n-type doping by dopant atoms in amorphous/nanocrystalline materials such as a-Si:H.

The blocking structure 26, photoconductor layer 22 and the surface layer 24 may be formed by any physical or chemical growth or deposition method known to those of skill in the art. The preferred method is plasma enhanced chemical vapor deposition (PECVD) although other techniques such as hot-wire CVD, sputtering or electro-deposition may be used for forming some or all of the layers. In case of PECVD, the gas source used for Si containing layers is typically silane ($SiH_4$) although other gases such as disilane ($Si_2H_6$), dichlorosilane (DCS), tetrafluorosilane ($SiF_4$) or combinations thereof may be used as well. The gas source used for Ge containing layers is typically germane ($GeH_4$). The gas source used for C containing layers is typically methane ($CH_4$), ethylene ($C_2H_4$), propylene ($C_3H_6$) but other sources (typically of the form $C_xH_y$) may be used as well. In-situ p-type doping is typically performed using diborane ($B_2H_6$) or trimethylboron (TMB) sources and in-situ n-type doping is typically performed using phosphine ($PH_3$) gas source, although other dopant sources may be used as well. Ammonia ($NH_3$), nitrous oxide ($N_2O$) or other gas sources may be used for nitrogen containing layers. Carbon dioxide ($CO_2$), $N_2O$ or $O_2$ may be used to provide oxygen for oxygen containing layers. A carrier gas such as hydrogen ($H_2$), deuterium ($D_2$) helium (He) or argon (Ar) may be used for any or all of the layers. The carrier gas may be pre-mixed with the gas sources or flowed simultaneously with the gas source at the time of growth.

A photoreceptor 20 as described above with respect to the exemplary embodiment of FIG. 2 can according be fabricated by providing an electrically conductive substrate, forming the multilayer blocking structure on the substrate, forming the photoconductor layer on the blocking structure, and forming the surface layer on the photoconductor layer. As discussed above with respect to one exemplary embodiment, the hydrogenated amorphous silicon germanium blocking layer(s) is effectively doped by the transfer of holes from the adjoining wide band gap semiconductor layers, resulting in one or more p+a-SiGe:H blocking layers that effectively block electrons injected from the electrically conductive substrate. The wide band gap semiconductor materials are formed in sufficiently small thicknesses, in the range of 5-25 nm for each layer and less than 50 nm in total thickness, to minimize electron injection from these layers and to prevent or reduce compromising carrier transport during illumination of the photoreceptor. The narrow band gap blocking layers are formed over the substrate in alternating sequence with the formation of the wide band gap semiconductor layers, resulting in both the top and bottom surfaces of each narrow band gap blocking layer 26A adjoining a wide band gap semiconductor layer 26B in the preferred embodiments. In some exemplary embodiments, however, the first layer grown on the conductive substrate 28 may be a narrow gap layer. In this case, only the top surface of the narrow gap layer would adjoin a wide gap layer. In other exemplary embodiments, the last layer grown in the blocking layer (prior to growing the photoconductor layer 22) is a narrow gap layer. In this case, only the bottom surface of this narrow gap layer would adjoin a wide gap layer. In the preferred embodiments, higher transfer doping is possible as holes are transferred from two adjoining wide gap layers instead of only one. The highly doped p+a-SiGe:H narrow band gap layer(s), such as shown in the exemplary embodiment of FIG. 4, may be formed as thin layers, each in the range of 3-30 nm, with a combined thickness preferably below 75 nm. The photoconductor layer is formed over the blocking structure 26, preferably followed by formation of the passivation or surface layer 24.

Given the discussion thus far, a photoreceptor as disclosed herein includes a photoconductor layer comprising a photosensitive material, an electrically conductive substrate layer, and a multilayer blocking structure between the substrate layer and the photoconductor layer. The blocking structure includes first and second wide band gap semiconductor layers and a narrow band gap blocking layer between and adjoining the first and second wide band gap semiconductor layers. The narrow band gap blocking layer is effective to block electron or hole injection from the electrically conductive substrate into the photoconductor layer. Wide band gap semiconductor layers preferably adjoin both the photoconductor layer 22 and the electrically conductive substrate 28 as shown in FIG. 2.

A photoreceptor in accordance with a further exemplary embodiment includes a photoconductor layer comprising a photosensitive material, an electrically conductive substrate layer, and a multilayer blocking structure between the photoconductor layer and the electrically conductive layer. The multilayer blocking structure, such as the structure 26 shown in FIG. 4, includes a plurality of wide band gap semiconductor layers 26B and one or more narrow band gap blocking layers 26A. The one or more narrow band gap blocking layers and the plurality of wide band gap semiconductor layers are arranged in alternating sequence. The narrow band gap blocking layer(s) are effective to block electron or hole injection from the electrically conductive substrate layer.

In accordance with a further aspect, a method of fabricating a photoreceptor includes providing an electrically conductive substrate 28 and forming a multilayer blocking structure 26 on the substrate. Formation of the multilayer blocking structure includes forming a plurality of wide band gap semiconductor layers 26B over the substrate, forming one or more narrow band gap blocking layers 26A having band gaps lower than the band gaps of the wide band gap semiconductor layers 26B over the substrate 28 in alternating sequence with the plurality of wide band gap semiconductor layers, causing transfer-doping of holes from the wide band gap semiconductor layers 26B to the one or more narrow band gap blocking layers 26A. The method further includes forming a photoconductor layer 22 comprised of photosensitive material on the multilayer blocking structure such that the one or more p+ narrow band gap blocking layers formed in accordance with this method are effective to suppress electron injection into the photoconductor layer. In an exemplary embodiment, the photosensitive material comprises a-Si:H and is formed on a wide band gap semiconductor layer 26B. In a further aspect, a wide band gap semiconductor layer 26B of the blocking structure 26 is formed on the electrically conductive substrate 28. A surface layer 24 is formed on the photoconductor layer 22 in accordance with a further exemplary aspect. The one or more narrow band gap blocking layers are comprised of hydrogenated amorphous germanium (a-Ge:H), hydrogenated amorphous silicon germanium (a-SiGe:H), hydrogenated nanocrystalline germanium (nc-Ge:H), hydrogenated nanocrystalline silicon-germanium (nc-SiGe:H), hydrogenated nanocrystalline silicon (nc-Si:H), hydrogenated nanocrystalline germanium oxide (nc-GeO:H) or hydrogenated nano-crystalline silicon-germanium oxide (nc-SiGeO:H) in accordance with further exemplary aspects. Each narrow band gap blocking layer 26A in a further exemplary embodiment is formed such that it adjoins two wide band gap semiconductor layers 26B, such as shown in FIG. 2. It will be appreciated that the blocking structure 26 shown in FIG. 2 may include fewer or more layers. The fabrication method may further include forming the layers of the blocking structure 26 in particular thicknesses as described in detail above.

A method substantially as described above may alternatively provide n+ blocking layer(s) for suppressing hole injection into the photoconductor layer 22 rather than p+ narrow gap blocking layer(s) for suppressing electron injection. Such a method involves causing transfer doping of the narrow band gap layer(s) 26A by transferring electrons from the wide band gap semiconductor layers 26B into the narrow band gap layers. A surface layer may be formed on the photoconductor layer, for example amorphous silicon nitride. The method may further include forming the multilayer blocking structure such that each narrow band gap blocking layer adjoins two wide band gap semiconductor layers. The method may include forming one of the wide band gap semiconductor layers on the substrate and forming the photoconductor layer on another one of the wide band gap semiconductor layers. The photosensitive material comprising the photoconductor layer used in the method may comprise hydrogenated amorphous silicon.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a photoreceptor, comprising:
providing an electrically conductive substrate;
forming a multilayer blocking structure on the substrate by:
forming a plurality of doped, p-type wide band gap semiconductor layers over the substrate, each of the wide band gap semiconductor layers being formed with a thickness between 5-25 nm, and
forming a plurality of narrow band gap layers having band gaps lower than the band gaps of the wide band gap semiconductor layers over the substrate in alternating sequence with and adjoining the plurality of doped, p-type wide band gap semiconductor layers, thereby causing transfer-doping of holes from the doped, p-type wide band gap semiconductor layers to the plurality of narrow band gap layers to form a plurality of doped p-type narrow band gap blocking layers;
forming a photoconductor layer comprised of photosensitive hydrogenated amorphous silicon on the multilayer blocking structure such that the plurality of doped p-type narrow band gap blocking layers are effective to suppress electron injection from the electrically conductive substrate into the photoconductor layer, and
forming an electrically insulating surface layer on the photoconductor layer, the photoconductor layer being positioned between the multilayer blocking structure and the electrically insulating surface layer.

2. The method of claim 1, wherein the electrically insulating surface layer comprises amorphous silicon nitride.

3. The method of claim 1, further including doping the photoconductor layer to produce a p-type photoconductor layer.

4. The method of claim 1, wherein the combined thicknesses of the wide band gap semiconductor layers is less than 50 nm.

5. The method of claim 1, wherein the plurality of narrow band gap blocking layers each has a thickness between 3-30 nm.

6. The method of claim 5, wherein the combined thicknesses of the narrow band gap blocking layers is less than 75 nm.

7. The method of claim 5, wherein one of the wide band gap semiconductor layers is formed in adjoining relation with a top surface of the substrate and the photoconductor layer is formed in adjoining relation with a top surface of a second of the wide band gap semiconductor layers.

8. The method of claim 1 wherein the plurality of narrow band gap blocking layers are formed of hydrogenated amorphous germanium (a-Ge:H), hydrogenated amorphous silicon germanium (a-SiGe:H), hydrogenated nanocrystalline germanium (nc-Ge:H), hydrogenated nanocrystalline silicon-germanium (nc-SiGe:H), hydrogenated nanocrystalline silicon (nc-Si:H), hydrogenated nano-crystalline germanium oxide (nc-GeO:H) or hydrogenated nano-crystalline silicon-germanium oxide (nc-SiGeO:H).

9. The method of claim 1, wherein at least one of the wide band gap semiconductor layers is formed of a-SiC:H, a-SiO:H, a-SiN:H, nc-SiC:H, nc-SiO:H, or nc-SiN:H.

10. The method of claim 1, further including forming one of the wide band gap semiconductor layers on a top surface of the substrate and forming the photoconductor layer on a top surface of another one of the wide band gap semiconductor layers.

11. The method of claim 10, further including forming the multilayer blocking structure such that each narrow band gap blocking layer adjoins and is transfer doped by two wide band gap semiconductor layers.

12. A method of fabricating a photoreceptor, comprising:
providing an electrically conductive substrate;
forming a multilayer blocking structure on the substrate by:
forming a plurality of doped wide band gap semiconductor layers having a first conductivity type over the substrate, and
forming a plurality of narrow band gap layers having band gaps lower than the band gaps of the wide band gap semiconductor layers over the substrate in alternating sequence with and adjoining the plurality of wide band gap semiconductor layers, each of the narrow band gap blocking layers having a thickness between 3-30 nm, causing transfer-doping of charge carriers from the wide band gap semiconductor layers to the plurality of narrow band gap layers to form a plurality of doped narrow band gap blocking layers of the first conductivity type;
forming a photoconductor layer comprised of photosensitive material on one of the wide band gap semiconductor layers of the multilayer blocking structure such that the one or more doped narrow band gap blocking layers are effective to suppress charge carrier injection from the electrically conductive substrate into the photoconductor layer, and
forming an electrically insulating surface layer on the photoconductor layer.

13. The method of claim 12, wherein the electrically insulating surface layer comprises amorphous silicon nitride.

14. The method of claim 12, further including forming one of the wide band gap semiconductor layers on a top surface of the substrate and forming the photoconductor layer on a top surface of another one of the wide band gap semiconductor layers.

15. The method of claim 14, further including forming the multilayer blocking structure such that each narrow band gap blocking layer adjoins two wide band gap semiconductor layers.

16. The method of claim 12, wherein the photosensitive material comprises hydrogenated amorphous silicon.

17. The method of claim 1, further including the step of doping the wide band semiconductor layers in situ using a p-type doping source.

18. The method of claim 16, wherein the charge carriers are holes and the first conductivity type is n-type.

* * * * *